(12) United States Patent
Kadu

(10) Patent No.: US 11,575,457 B2
(45) Date of Patent: Feb. 7, 2023

(54) POWER-SMART PACKET PROCESSING

(71) Applicant: Avago Technologies International Sales Pte. Limited, Singapore (SG)

(72) Inventor: Sachin Prabhakarrao Kadu, Fremont, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 151 days.

(21) Appl. No.: 17/152,675

(22) Filed: Jan. 19, 2021

(65) Prior Publication Data

US 2022/0231776 A1 Jul. 21, 2022

(51) Int. Cl.
*H04J 3/06* (2006.01)
*G06F 1/08* (2006.01)
*G06F 1/3209* (2019.01)
*G06F 1/3234* (2019.01)

(52) U.S. Cl.
CPC .............. *H04J 3/0697* (2013.01); *G06F 1/08* (2013.01); *G06F 1/3209* (2013.01); *G06F 1/3278* (2013.01)

(58) Field of Classification Search
CPC .... H04J 3/0697; G06F 1/3278; G06F 1/3209; G06F 1/08
See application file for complete search history.

(56) References Cited

U.S. PATENT DOCUMENTS

| | | | |
|---|---|---|---|
| 2004/0052316 A1* | 3/2004 | Choi | H03K 5/135 375/326 |
| 2010/0011174 A1* | 1/2010 | Oh | G11C 7/222 711/E12.002 |

* cited by examiner

*Primary Examiner* — Brenda H Pham
(74) *Attorney, Agent, or Firm* — BakerHostetler

(57) ABSTRACT

A method for power-smart packet processing includes, in response to an event trigger signal, generating, by a state machine, a number of enable signals. The method further includes applying the enable signals to a number of single-level inferred clock (SLICK) gates to generate multiple clock signals with cycles of latency. The clock signals are applied to at least some of a number of groups of flops used for packet processing. The enable signals are clock-gated enable signals that start at consecutive cycles of a main clock, and stay active for at least one cycle of the main clock. The method further includes using flow-aware clock-gating technology (FACT) to distinctly identify logic and tables and continually variable traffic (CVT) to control packet rate and packet spacing.

20 Claims, 15 Drawing Sheets

POWER-SMART PACKET PROCESSING

TECHNICAL FIELD

The present description relates generally to integrate circuits and, in particular, to power-smart packet processing.

BACKGROUND

High-performance computing and other demanding scale-out applications in the datacenter continue to require higher port counts, larger bandwidth, and reduced latency and power efficiency in packet-processing devices, such as network switches and routers. Power consumption improvements from process node geometry reductions are fast approaching intense physical limitations. Thus, sole reliance on process node improvements may be insufficient to keep up with increasing performance demands for packet-processing devices.

Some previous approaches for power saving, such as running ingress and egress pipelines at a lower frequencies, may result in latency and require a second clock tree (decoupled packet-processing clock). Other power-saving approaches are based on clock frequency modulation, such as dynamic frequency scaling or traffic modulation, which can be complex and/or increase chip area and latency.

Power saving can also be achieved by clock gating so that flops that are not active are not clocked. Synthesis-inferred clock gating (SIG) and per-stage clock gating (PSG) have also been used for power saving. In actual implementation, the PSG trigger and the SIG enables are very similar, if not the same. For idle and peak-power cases, both of the clock gates are either on or off, rendering one of the clock gates redundant. This process brings clock-gating efficiency significantly down and increases the clock-gating cost for no additional savings. Also, the PSG can cover all of the stage flops; however, PSG activates the clock for the entire latency of the stage. For achieving any power savings, inactivity periods need to be longer than stage latency, which with higher stage latencies, can make power saving much less probable for a given traffic pattern. Further, multiple levels of clock gating after H-tree tap, inside a sink grid box, is not design tool and/or flow friendly. For SIG and PSG clock gating, the enables are not granular enough to control mutually exclusive logic for flows. As the start of processing (SOP) trigger exercises most of the logic of the pipeline stages, this scheme may not be able to address peak power reduction.

Per-cycle clock gating (PCG) scheme with independent SIG can replace PSG with per cycle enables. However, most of the enable timings are still common between current PCG and SIG. In addition, PCG uses two levels of clock gating and is not capable of addressing peak power reduction.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

Figure 1:
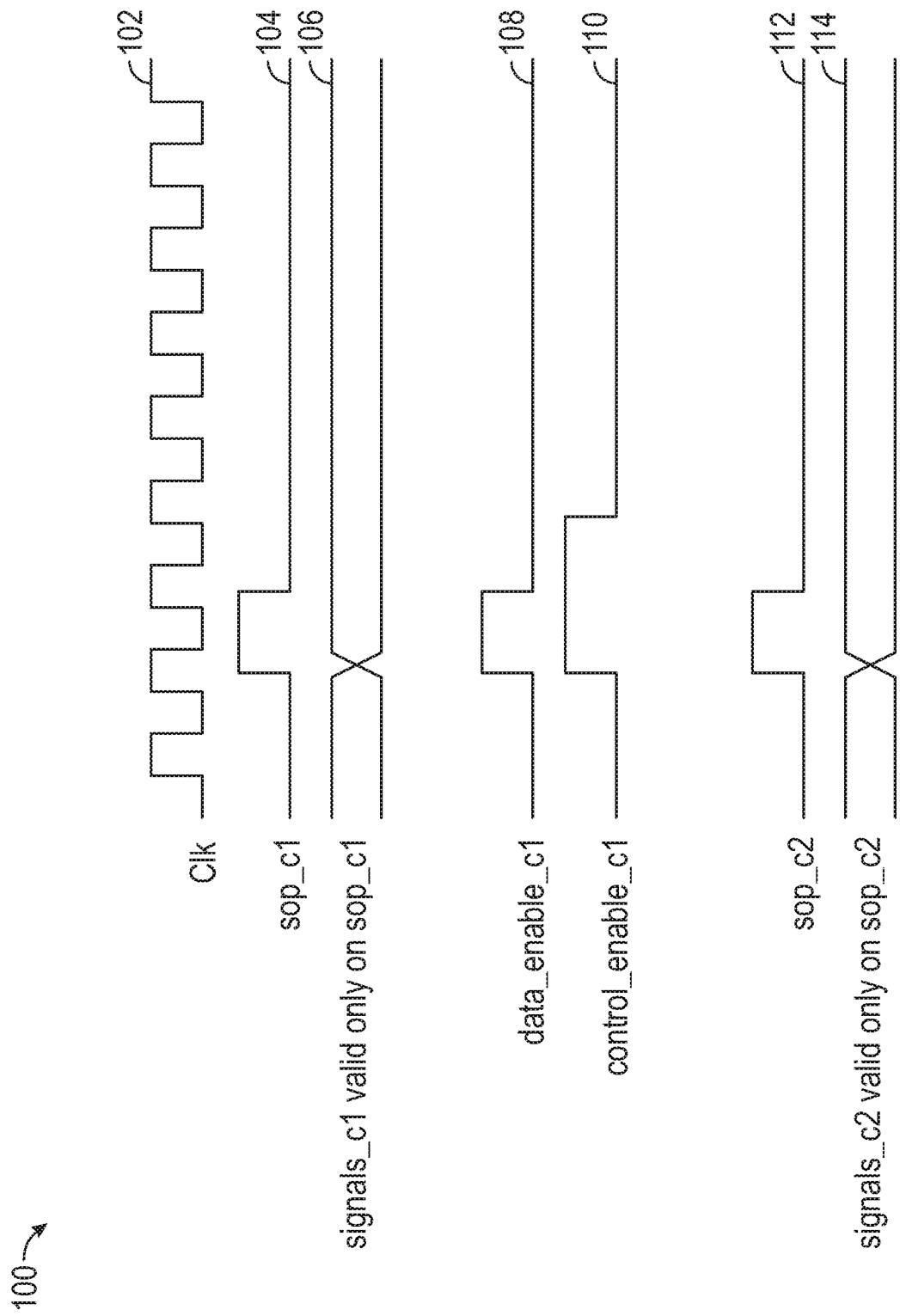
FIG. 1 is a chart illustrating example of data and control signals for power-smart packet processing, according to various aspects of the subject technology.

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

The subject technology is directed to methods and systems for power-smart packet processing. The subject technology leverages single-level inferred clock SLICK gating that is always single level (no hierarchy of clock gates), and is inferred by synthesis rather than manual instantiation. The SLICK gating uses manual instantiation of clock gates only for very special cases, such as multicycle designware (DW) Internet protocols (IPs). The SLICK gating uses PCG enables for the control flops, which do not have current and flow-aware clock-gating technology (FACT based SIG enables. The SLICK gates are not only very structural and efficient clock gates, but they are also functional clock gates (with no complexity for design, verification, design for test) and are physical design-tool friendly. Specifically, replication and/or drive strength and/or fan-out of the inferred gates is automatically adjusted by the tools for the optimal timing-area-power trade-off.

The disclosed SLICK gating has a number of advantages. For example, (100%) of stage flops can be clock gated with only a single level of clock gates, which completely eliminates the redundant gates. The enable signals are functional signals, and no manual instantiation of clock gates are necessary to simplify implementation and verification stages. Further, saving power in SLICK gating imposes no requirements on long inactivity patterns, which is a great advantage in traffic throttling a well, as explained in more detail herein. The disclosed SLICK gating can keep the enable signals from current SIG scheme, and additional enables can be included for granular clock gating (e.g., in FACT, which is covered later). These enable signals address peak-power reduction. The SLICK gating of the subject technology can use about 35% less clock gates compared to a PSG-plus SIG scheme with the same number of enable signals. In terms of clock-gating enables by definition, (a) FACT is identified as the most efficient and most granular clock gating enables; (b) most, if not all, clock gating enables now can be single cycle only, providing the best power savings possible; (c) it is simple and easy to identify, code and automate these enables; and (d) FACT enables will address peak-power reduction and not just average- or low-performance power.

The subject technology further controls active events, which traditionally, is achieved by dynamic frequency scaling (DFS) or some traffic modulation schemes. Both of these techniques have significant area cost and/or significant increase in the design complexity. The continuously variable traffic CVT scheme of the subject technology avoids most of the cost and complexity and still provides an effective way to control active events for optimal performance-power tradeoff. Other power saving aspects of the subject technology include removal of phantom activity and reduction of combinational toggle, programmable enables for static features, and per physical block gating, as discussed in more detail herein.

FIG. 1 is a chart 100 illustrating examples of data and control signals for power-smart packet processing, according to various aspects of the subject technology. The chart 100 includes a number of signals including signals 102, 104, 106, 108, 110, 112 and 114. The signal 102 is a clock signal 102. The signal 104 is a start of process (SOP)_c1 signal, which is a control signal and indicates the validity of the data signal. The signal 106 represents data signals_c1 valid only on SOP_c1. The signal 108 is a data enable_c1 signal that is a single cycle clock-gating enable. The signal 110 is a control_enable_c1 signal that is a clock gating enable allowing assertion and deassertion. The signal 112 is a SOP_c2 signal, which is responsible for deassertion of control signal that is critically important. The signal 118 represents data signals_c2 valid only on the SOP_c2, with no need to deassert data signals.

Figure 2A:
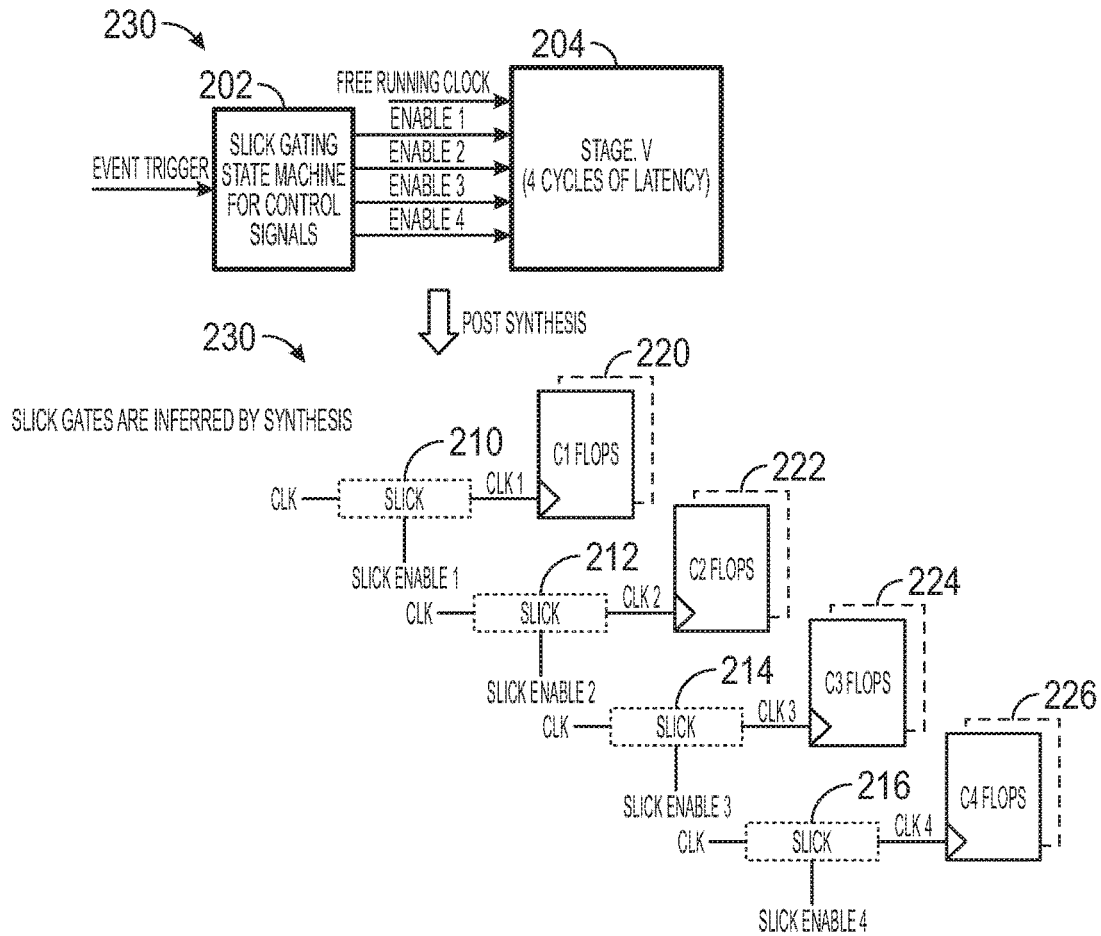
FIG. 2A is a schematic diagram illustrating examples of single-level inferred clock (SLICK) gating register-transfer level (RTL) and post-synthesis representations, in accordance with some aspects of the subject technology.

FIG. 2A is a schematic diagram illustrating examples of a SLICK gating RTL representation 230 and a post-synthesis representation 230, in accordance with some aspects of the subject technology. The RTL representation 230 includes a state machine 202 and a latency block 204. The state machine 202 receives an event trigger and in response, generates control signals, including SLICK enable signal (Enable 1 through Enable 4). The delay block 204 receives a free running clock and the enable signals generated by the state machine 202 and provides four cycles of latency. The post-synthesis representation 230 includes SLICK gates 221 through 224 that are single level and are inferred by synthesis without manual instantiation. The SLICK gates 221 through 224 are coupled to clock inputs of respective flop groups 225 through 228. The SLICK gates receive the free-running clock and SLICK enable signals 1 through 4 (Enable 1 through Enable 4) and generate clock signals CK1 through CK4, respectively, for the groups of flops 225 through 228. Each group of flops (e.g., 225) can include a large number of flops, for example, up to $10^5$ flops. An important issue here is the generation of SLICK enable signals 1 through 4, which will be discussed in more detail later in the disclosure.

Figure 2B:
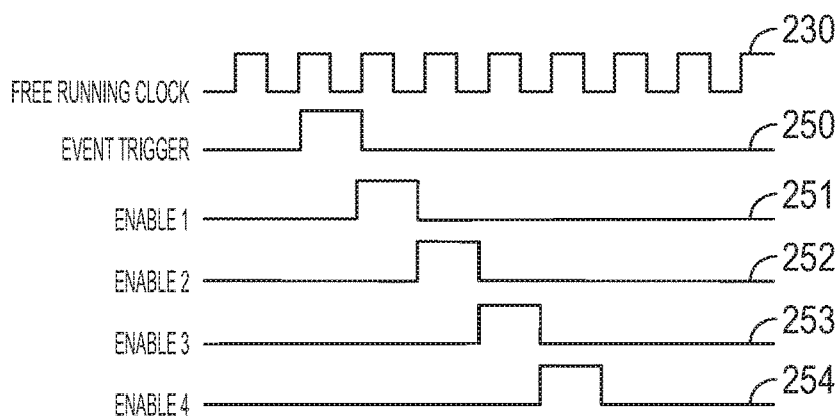
FIG. 2B is a chart illustrating examples of clock, enable trigger and enable signals for the SLICK representations of FIG. 2A, in accordance with some aspects of the subject technology.

FIG. 2B is a chart 230 illustrating examples of a clock, an enable trigger and enable signals for the SLICK representations of FIG. 2A, in accordance with some aspects of the subject technology. The chart 230 includes a free-running clock signal 231, an event trigger signal 240 and enable signals 240 through 244. In the example of FIG. 2B, the event trigger signal 240 starts at the second cycle of the free-running clock signal 231 and lasts one clock cycle. The enable signal 241 (Enable 1) starts at the end of the event trigger signal 240 and stays on for a duration of two clock cycles. The other enable signals 242, 243 and 244 (Enable 2, Enable 3 and Enable 4) start with one clock cycle delay with respect to their respective predecessor enables, and each stays on for a duration of two clock cycles.

Figure 3:
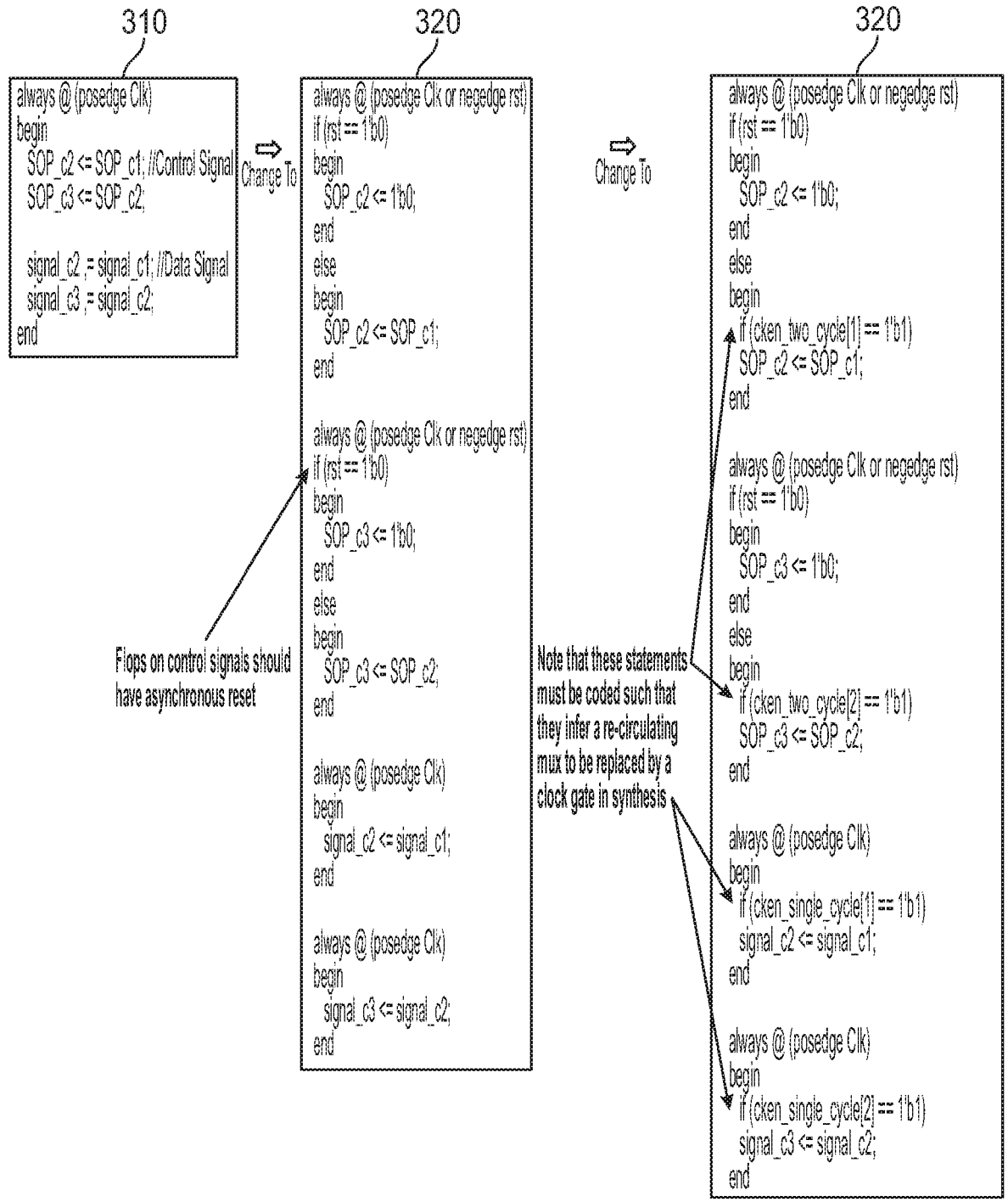
FIG. 3 is a diagram illustrating examples of an RTL code and corresponding updates to separate out sequential always blocks for clock and data, in accordance with some aspects of the subject technology.

FIG. 3 is a diagram illustrating examples of an RTL code 310 and corresponding updates 320 and 330 to separate out sequential always blocks for clock and data, in accordance with some aspects of the subject technology. In the update 320 to the RTL code 310, sequential always blocks for clock and data are separated out. Also, sequential always blocks for different cycles are separate out. Further, flops on control signals should have asynchronous resets. In the update 330 to the RTL code 320, two cycles clock-gating enables are used for flops on control signals, so that the signals can assert and then de-assert and remain de-asserted when clock is gated. Also, single cycle clock-gating enables are used for the data signals, as they are only valid with the control signals. As shown in FIG. 3, the if statements has to be coded such that they infer a recirculating multiplexer (MUX) to be replaced by a clock gate in synthesis.

Figure 4A:
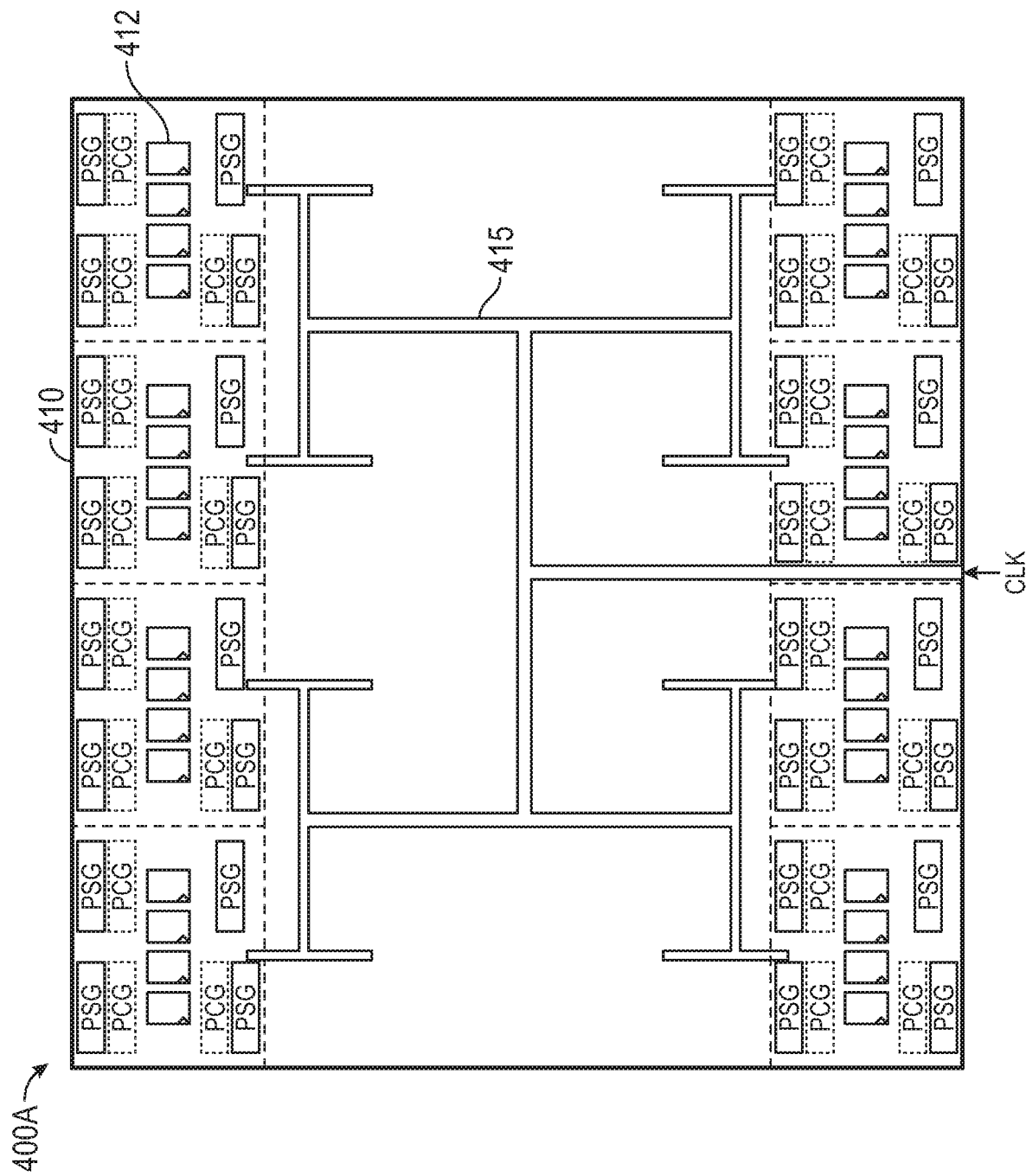
FIGS. 4A and 4B are schematic diagrams illustrating examples of chips with and without SLICK gating, in accordance with some aspects of the subject technology.
Figure 4B:
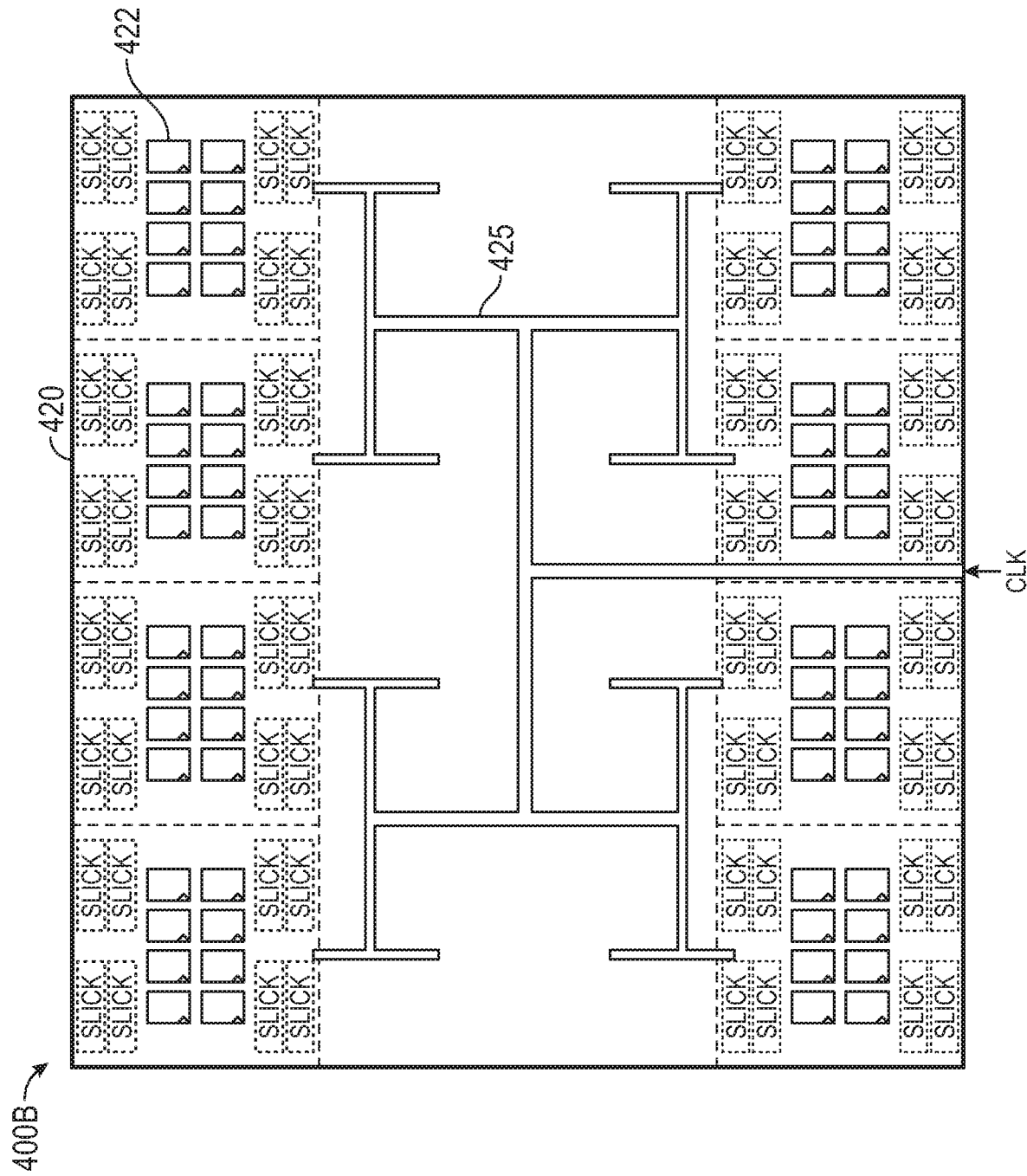

FIGS. 4A and 4B are schematic diagrams illustrating examples of chips 400A and 400B with and without SLICK gating, in accordance with some aspects of the subject technology. The chip 400A includes a number of blocks 410 (e.g., sink grid blocks) and a H-tree clock distribution 415. Each block 410 includes a number of flops 412 and a number of PSG, and PCG blocks.

The chip 400B of FIG. 4B includes a number of blocks 420 (e.g., sink grid blocks), each including a larger group of flops 422 (compared to 412 of FIG. 4A) and a number of single level SLICK gates cloaked through a H-tree clock distribution 425, which is smaller than the H-tree clock distribution 415 of FIG. 4A. The single level of gating used in the chip 400B helps reducing clock skew; hence, enables possibility of increasing sink grid block size, which, in turn, reduces H-Tree clock distribution levels and size that can result in further reduced clock power. Single level of gating is tool friendly, thus can enable tools to push/pull the gates at optimal level within the sink grid box, for optimal timing-area-power tradeoff, reducing cost of clock gating.

In summary, the disclosed SLICK gating has a number of advantageous features. For example, 100% of design flops can be clock gated with only one level; single level of clock gates completely eliminate the redundant gates increasing the clock gating efficiency significantly; enables are functional signals; no manual instantiation of clock gates, simplifying implementation and verification; no requirements on long inactivity patterns to save power, which is a big plus, even beyond this context, as will be explained in CVT section; and additional enables can be easily integrated, as they become available during the development cycle, for granular clock gating (like FACT, which is covered later). These enables will address peak-power reduction, not just average- or low-performance power.

Figure 5:
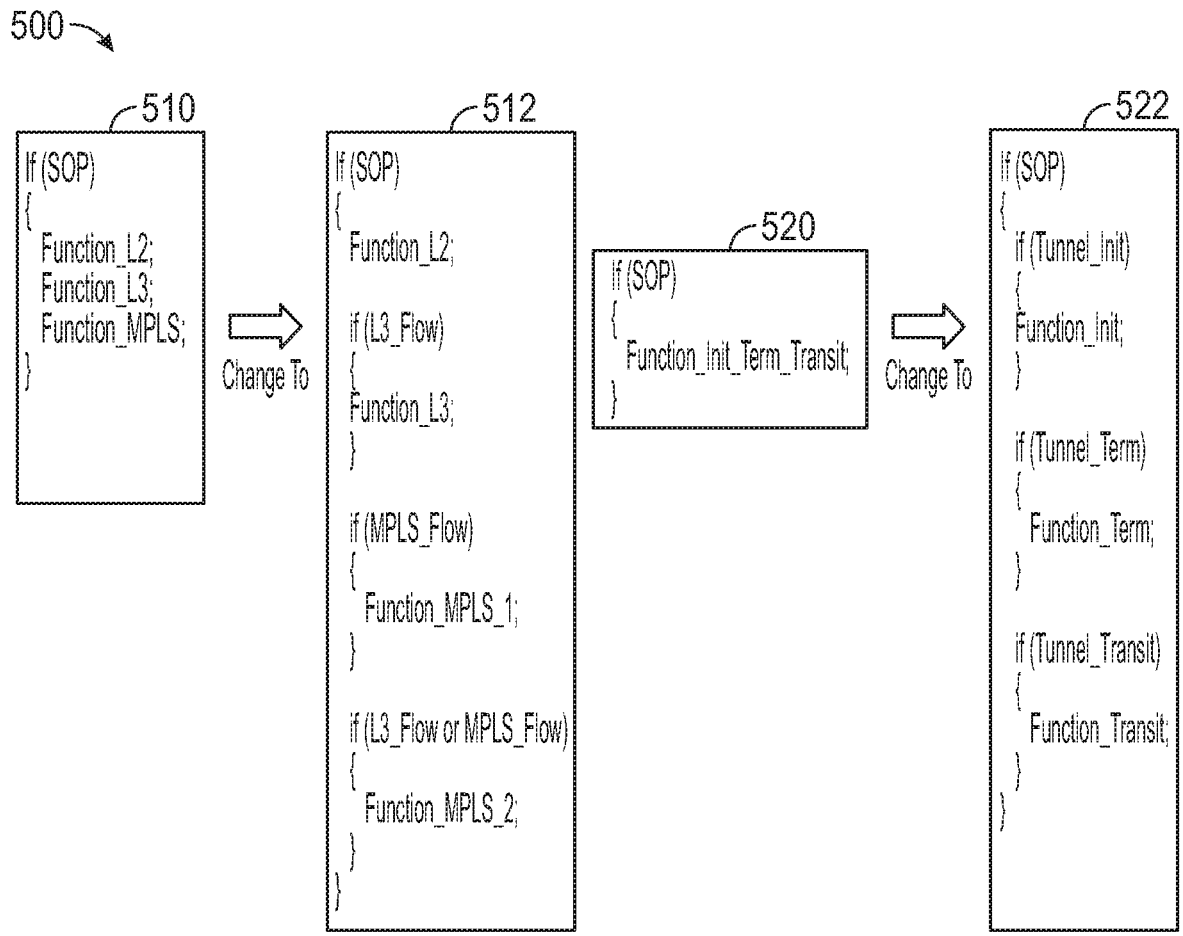
FIG. 5 is a diagram illustrating examples of a flow-aware clock-gating technology (FACT) pseudo code and corresponding simplification updates, in accordance with some aspects of the subject technology.

FIG. 5 is a diagram illustrating examples of a FACT pseudo code 510 and corresponding simplification updates, 512 and 522 in accordance with some aspects of the subject technology. The idea behind FACT is to distinctly identify logic as well as tables, which light up only for specific flows (e.g., L3 versus multiprotocol local switching (MPLS) or Tunnel Init/Term vs Transit) and code them in RTL with those enables in place with recirculating multiplexers (MUXes). Also, to implement logic to infer recirculating MUXes, a given function needs to be activated only if enable=1, but previous signal values need to be "held" when enable=0. All these FACT enables will then become more granular enable signals together with the SLICK triggers. Further, FACT provides a practical and effective way to clock gate mutually exclusive logic and optional functions to create optimal power profiles for actual use cases and save peak power. Main categories of use cases include tables, buses, and blobs of logic. For example, static enables can be employed for tables and logic for most used power profiles. Dynamic enables can be employed for unused tables and logic in a given flow. With regard to enables per bus, the bus should be populated and values should be changed only when required for a given flow. This will also reduce combinatorial logic toggle downstream.

In reference to of FIG. 5, the FACT pseudo code 510 may run large functions in L2, L3, and MPLS. In the updated version 512, the enables are identified at the right granularity per stage and/or block, for example, an a flow vector. In the updated version 514, large functions are broken into smaller, mutually exclusive ones if required, to effectively use the identified set of enables, and separate arch-shells are generated to identify signals to be gated by new enables.

Figure 6:
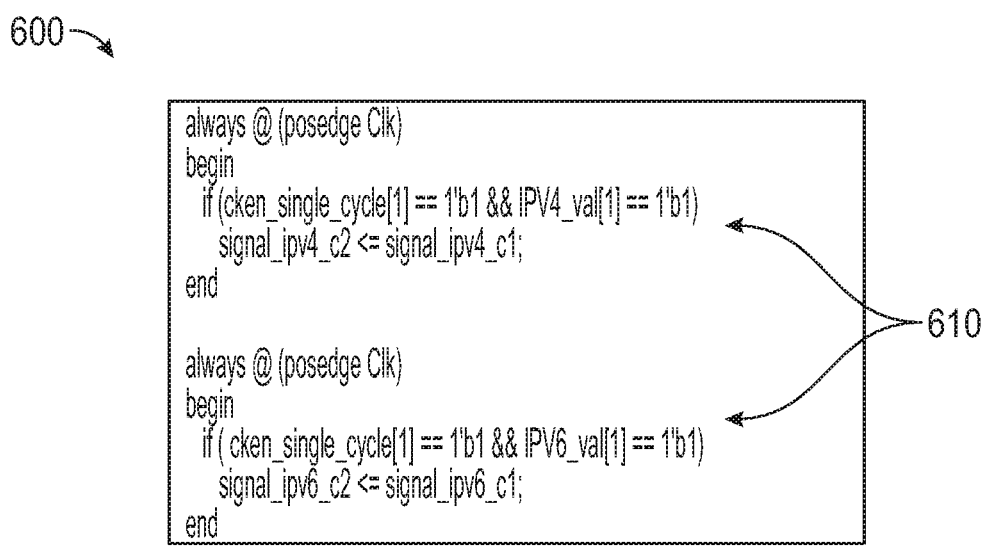
FIG. 6 is a diagram illustrating an example of adding FACT enables to SLICK gating, in accordance with some aspects of the subject technology.

FIG. 6 is a diagram illustrating an example of adding FACT enables to SLICK gating code 600, in accordance with some aspects of the subject technology. The if statements 610 in the code 600 are examples of more granular FACT enables.

Figure 7:
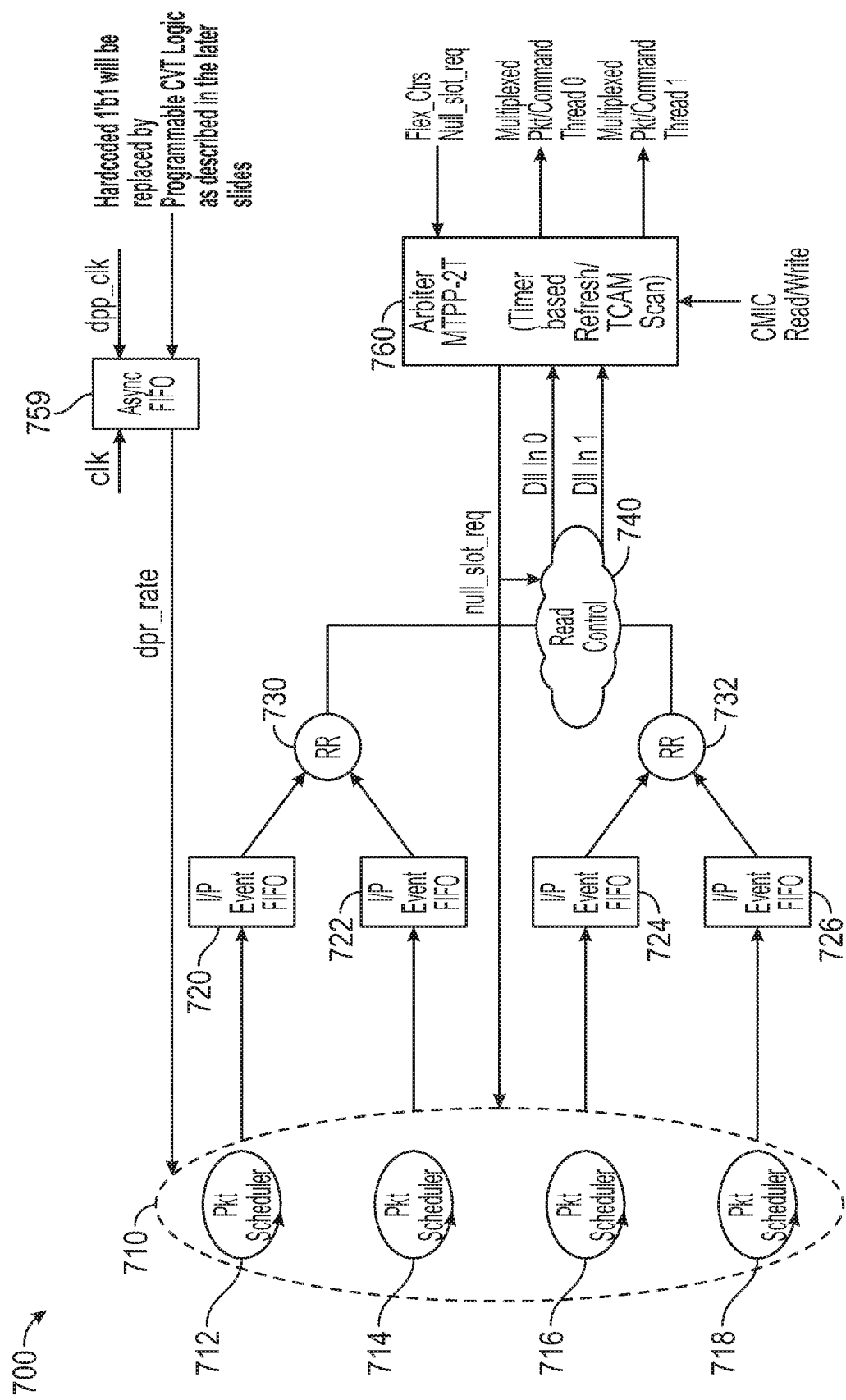
FIG. 7 is a schematic diagram illustrating an example implementation of a continually variable traffic (CVT) scheme, in accordance with some aspects of the subject technology.

FIG. 7 is a schematic diagram illustrating an example implementation 700 of a CVT scheme, in accordance with some aspects of the subject technology. The CVT scheme is the infrastructure to precisely control packet rate and packet spacing. The current traffic throttling options such as DFS and batching with PBG have their own disadvantages. For example, DFS has complexity and cost because of issues such as spatial and temporal clock variance and response time. The batching with PBG suffers from a large latency cost, chip area cost or loss of OBM performance.

The CVT scheme takes advantage of traffic pattern to save power, for example, by shutting off SLICK global control-enabled clock gates that require more than two cycles of inactivity. Back-to-back synchronized null slots can be used across threads to take care of atomicity issues by using TCAM and DR-XOR to take care of any silicon issues related to bypass cases. The CVT scheme supports a dynamic profile selection to precisely control increase of operating power without sacrificing performance, and reduces a number of transitions to a lowest possible level in a given traffic profile to save cell logic power. The CVT scheme further controls active events across pipes in a chip quadrant and staggers active events across the chip quadrants, as allowed by a given traffic pattern. In some aspects, one or more processors (internal and/or external) can be used to monitor conditions and program the CVT accordingly. Further, a timer may be provided to enable automatic switching over to different profiles in case a faster response than a profile supported by the one or more processors is required. The Timer should support faster switchover than can be supported by the processors (internal and/or external).

The CVT scheme implementation 700 includes a scheduler block 710, I/P event first-in-first-out (FIFO) blocks 720. 722, 724 and 726, refresh-refresh (RR) blocks 730 and 732, a read control block 740, an arbiter MTPP-2T block 760 and an asynchronous (Asynch) FIFO block 759. The scheduler block 710 includes a number of packet schedulers 712, 714, 716 and 718, which provide signals for the IP event FIFO blocks 720. 722, 724 and 726 that, in turn, feed the RR blocks 730 and 732. The output of the RR blocks 730 and 732 are separately received by the read control block 740, which also receive a nul_slot_req signal and generates delay line signals DII ln o and DII ln 1 for the arbiter MTPP-2T 760. The arbiter MTPP-2T 760 further receives a Flex-Ctrs Nul_slot_req signal and generates two threads (Thread 0 and Thread 1) of a multiplexed Pkt/Command and a null_slot_req signal for the scheduler block 710. The Async FIFO 759 receives two clock signals (clk and dpp_clk) and a signal from a programmable CVT logic that replaces a hardcoded 1'b1 block. The Async FIFO 759 produces a dpr_rate signal that is fed to the scheduler block 710.

Figure 8:
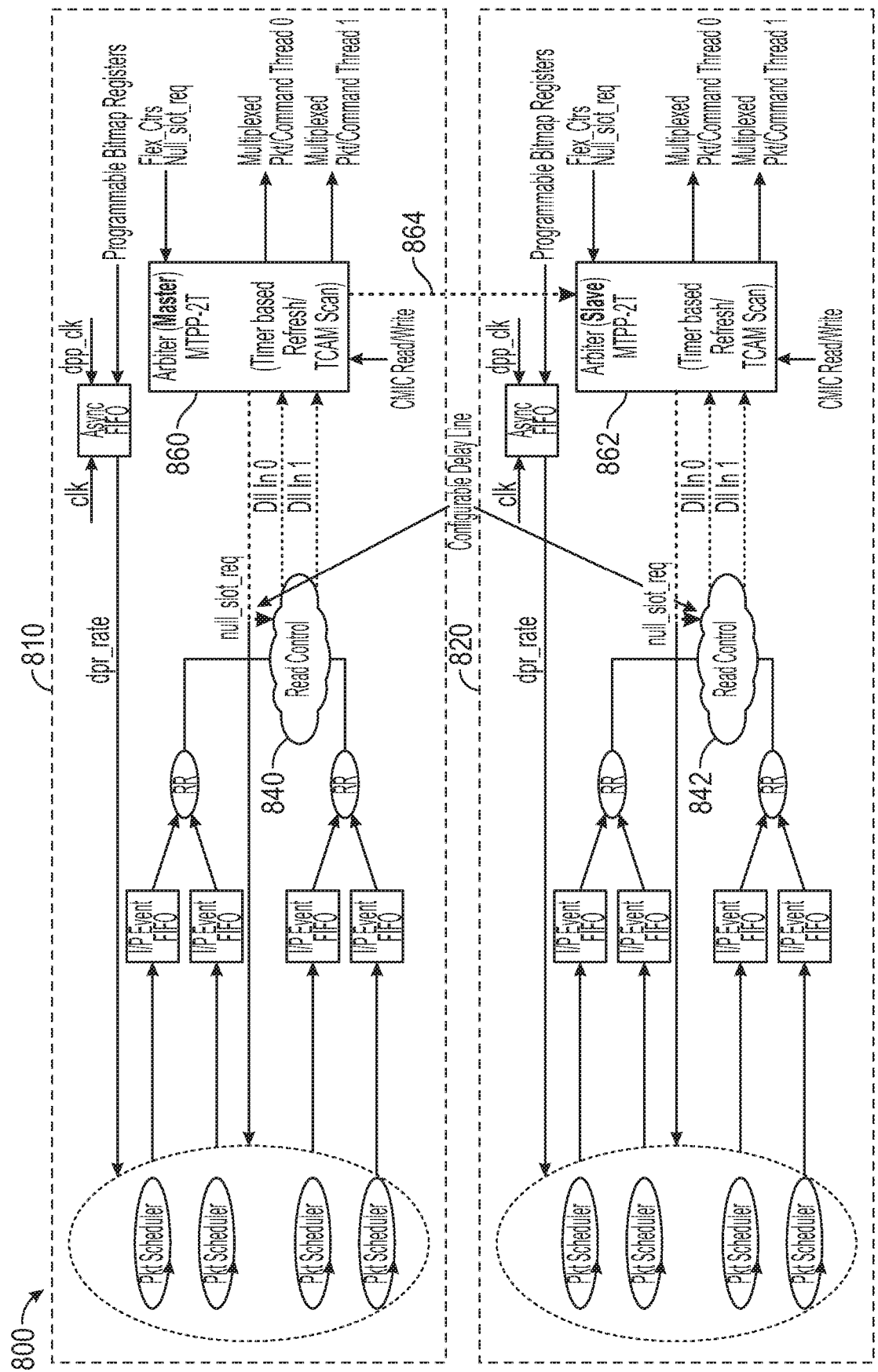
FIG. 8 is a schematic diagram illustrating an example implementation of a CVT scheme across pipes, in accordance with some aspects of the subject technology.

FIG. 8 is a schematic diagram illustrating an example implementation of a CVT scheme 800 across pipes, in accordance with some aspects of the subject technology. The CVT scheme 800 consists of two CVT blocks 810 and 820, which are generally implemented similar to the CVT scheme implementation 700 of FIG. 7, except that the Arbiters 860 and 862 are now operating as master and slave MTPP-2T blocks, a branch of the null_slot_req signals are fed to the Read Control blocks 840 and 842, and an 864 control signal is provided by the master Arbiters 860 to the slave Arbiters 862. The null_slot_req signals fed to the Read control blocks 840 and 842 make the delay line signals DII ln o and DII ln 1 configurable delay lines.

Figure 9:
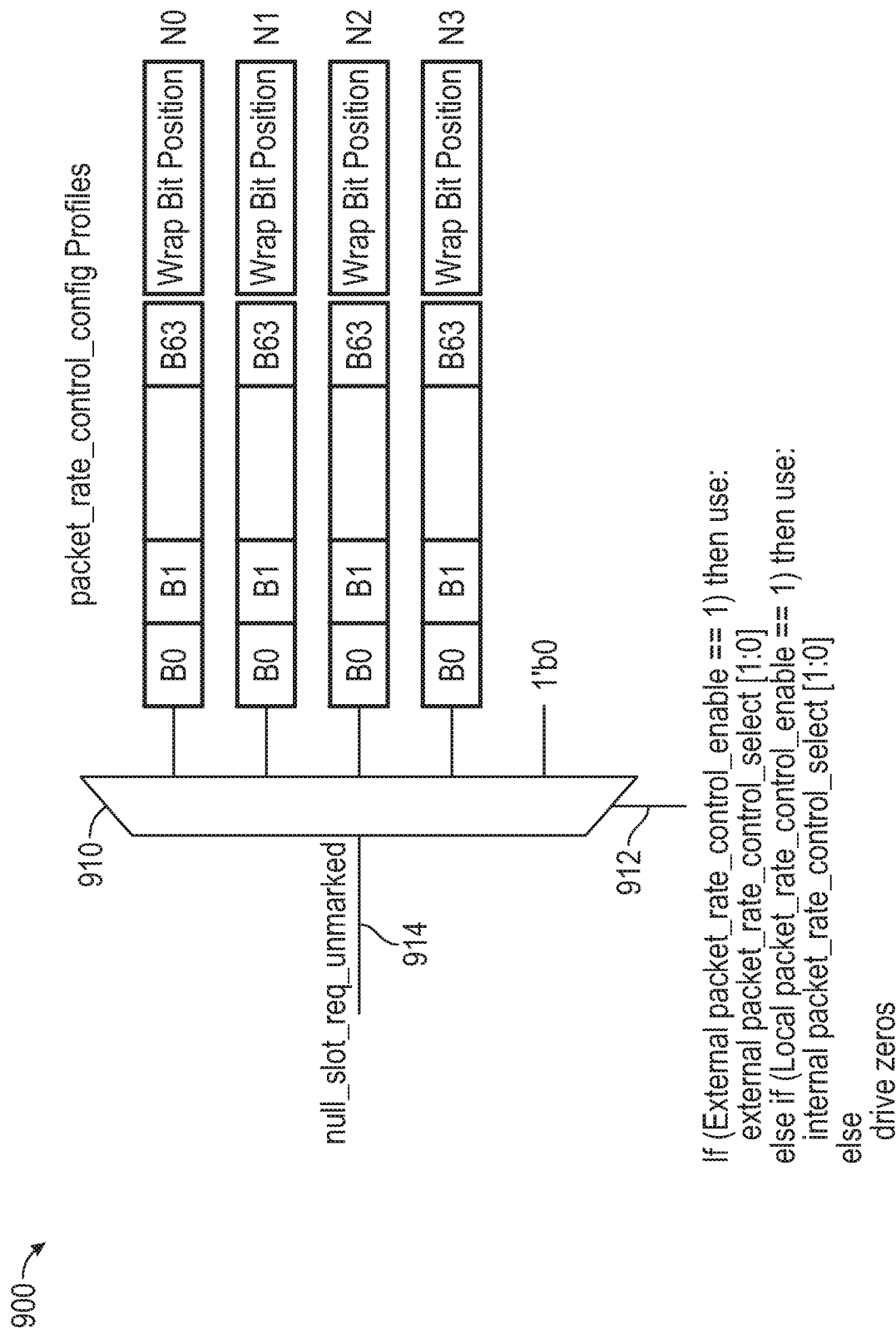
FIG. 9 is a schematic diagram illustrating an example implementation of a precise CVT-packet-rate control (-PRC) scheme, in accordance with some aspects of the subject technology.

FIG. 9 is a schematic diagram illustrating an example implementation of a precise CVT-packet-rate control (-PRC) scheme 900, in accordance with some aspects of the subject technology. The CVT-PRC scheme 900 is implemented using a MUX 910 and an enable signal 912, which can be changed dynamically to allow different packet_rate_control_config profiles be read by the MUX 910. The enable signal 912 allows selection of an appropriate packet_rate_control_config bitmap to be read to drive a null_slot_req_unmarked signal 914. Packet rate control is per pipe (T0/T1), and the start and switchover will be synchronized across Mater and Slave pipes. This will allow for precise distribution of active events across pipe 0 and pipe 1, for a given pattern. The enable signal 912 can be changed dynamically, and the updates on interface take effect on N0/1/2/3 boundaries with previous values on N0/1/2/3 and Wrap Bit Positions.

Figure 10:
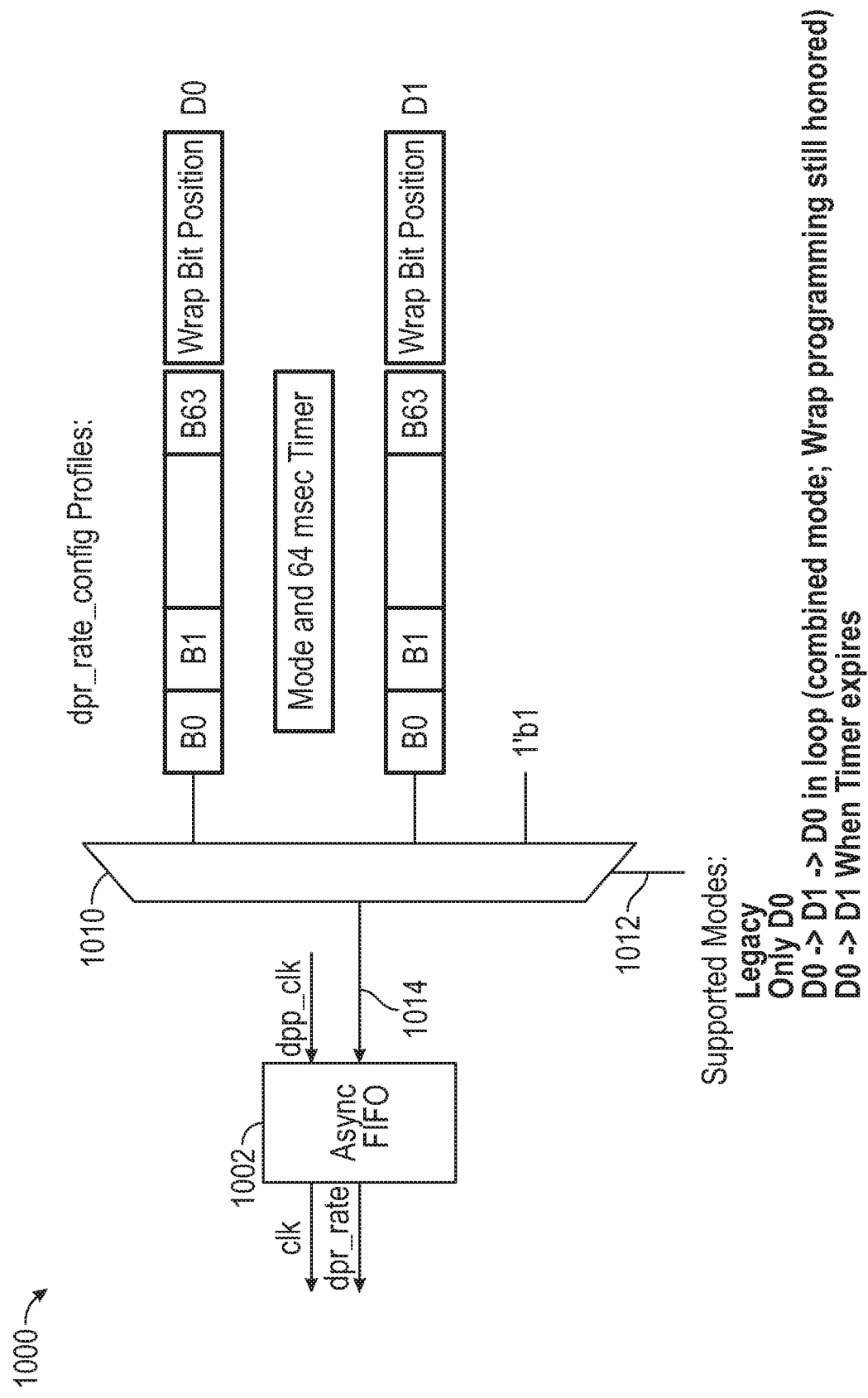
FIG. 10 is a schematic diagram illustrating an example implementation of a CVT-decoupled packet processing (DPP) ratio control (DRC) scheme, in accordance with some aspects of the subject technology.

FIG. 10 is a schematic diagram illustrating an example implementation of a CVT-decoupled packet processing (DPP) ratio control (DRC) scheme, in accordance with some aspects of the subject technology. The CVT-PRC scheme 1000 is implemented using a MUX 1010 and an enable signal 1012, which allows on of dpr_rate+config profiles to be read by the MUX 1010 to drive an input signal 1014 for the Async FIFO 1002, which generates a dpr_rate signal based on the input signal 1014.

The active dpr_rate_config profile bitmap will be read to drive dpr_rate signal. Timer should support faster switchover than can be supported by internal/external processors. DPR ratio control will be per pipe (T0/T1), and the start and switchover will be synchronized across master and slave pipes. This will allow coarser, but still controlled, distribution of active events across pipe 0 and pipe 1, for a given pattern. Default values support legacy dpr_rate functionality: Tied to 1'b1: (mode=legacy). The new programming updates take effect on 2×D0 (in mode D0) or D+D1 (in Mode D0→D1→D0) or 2×D0/1 (in mode timer) boundary with previous D0/1 and wrap bit position values. Switching from legacy to other modes is in only one cycle.

Figure 11:
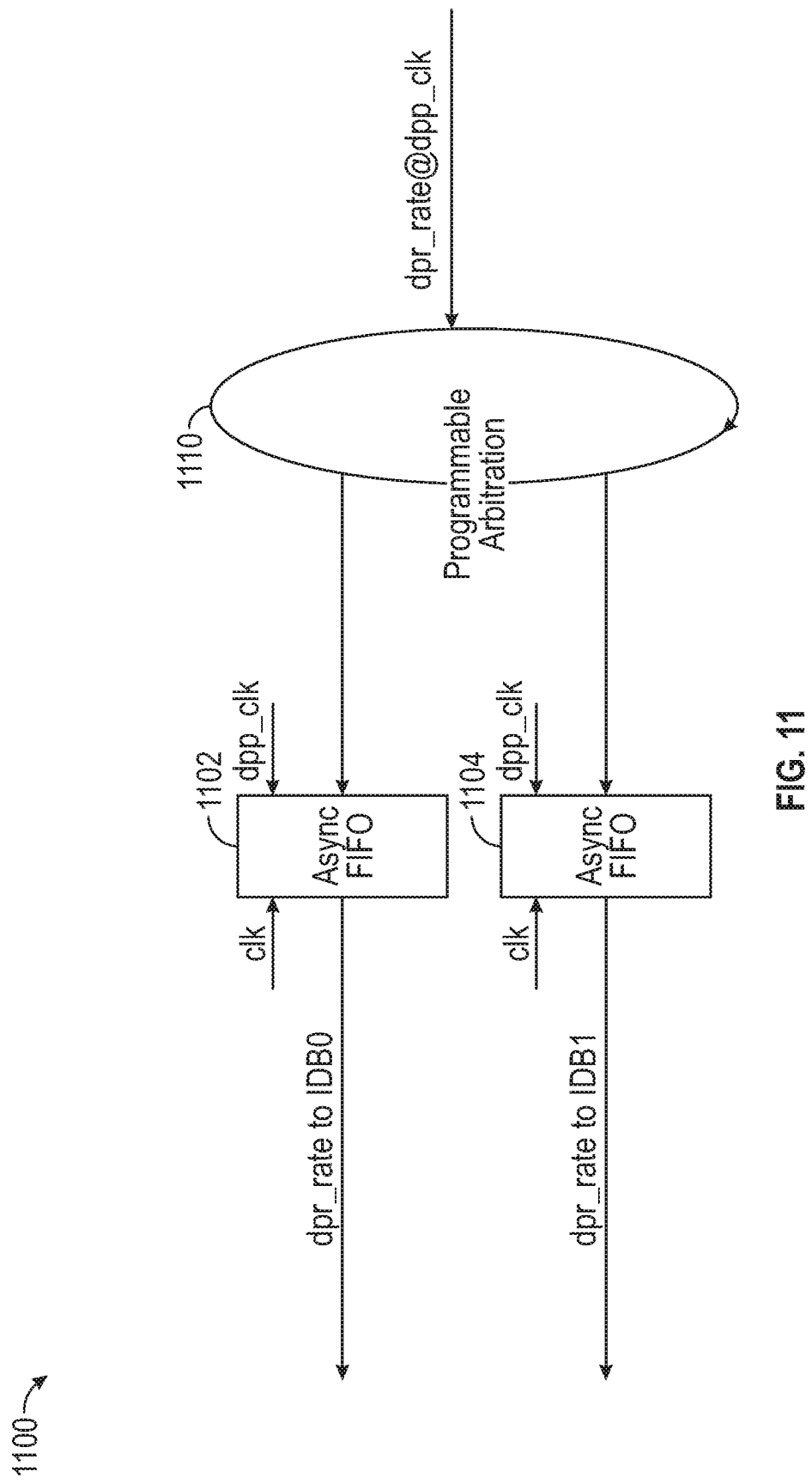
FIG. 11 is a schematic diagram illustrating an example implementation of a CVT scheme when DPP clock frequency is higher than clock frequency, in accordance with some aspects of the subject technology.

FIG. 11 is a schematic diagram illustrating an example implementation of a CVT scheme 1100 when DPP_clock frequency is higher than the free-running clock frequency, in accordance with some aspects of the subject technology. In the CVT scheme 1100 as implemented in FIG. 11, a programmable arbitration block 1110 receives a dpr_rate@dpp_clk signal to drive input ports of Asynch FIFO's 1102 and 1104 to generate dpr_rate to IDB0 and dpr_rate to IDB1 signals, respectively.

After discussing SLICK and CVT schemes in reference to the subject technology, it is appropriate to discuss some advantageous features of these schemes. For example, in the SLICK and CVT schemes, (1) no clock and traffic modulation, beyond CVT, is required to save power for lower packet-rate SKUs; (2) no IPEP latency impact is observed because there is no need to reduce clk_dpp frequency for lower packet rate SKUs; (3) increasing Input/Output Event FIFO depths, OBM buffer and other structures for lower packet rate SKUs can be avoided; (4) savings potential is significant; (5) clk_dpp can be completely removed, savings significant complexity, improving design margins and in turn allowing for better area optimizations; and (6) the same mechanism can be used to provide atomicity for ternary content-addressable memory (TCAM) and other data structures as well as programmable packet spacing with respect to CPU commands to patch and avoid bypass bugs found in silicon, directly in the field just by programming changes.

Figure 12:
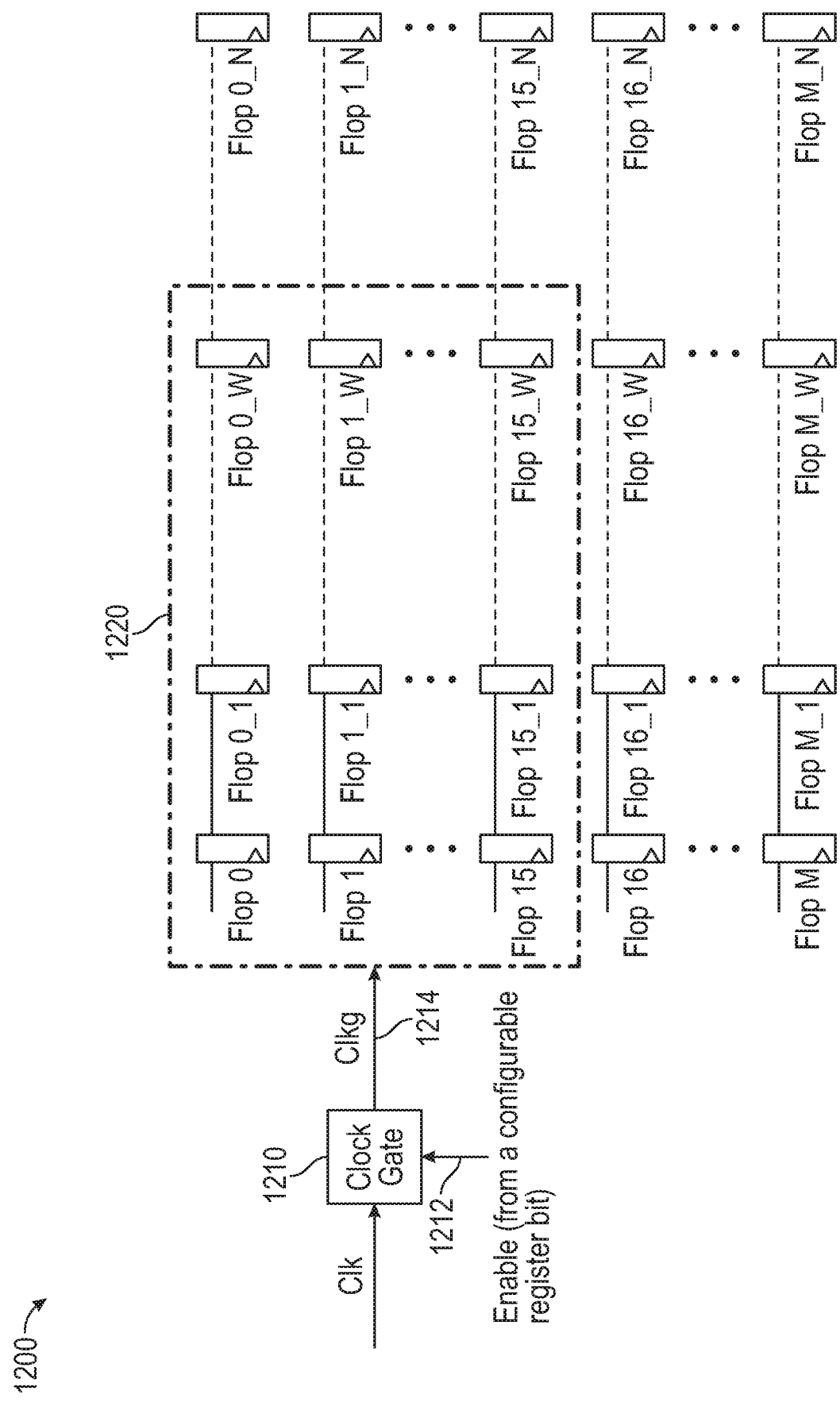
FIG. 12 is a schematic diagram illustrating an example implementation of programmable enables, in accordance with some aspects of the subject technology.

FIG. 12 is a schematic diagram illustrating an example implementation of programmable enables 1200, in accordance with some aspects of the subject technology. The programmable enables 1200 are applied to statistically enabled and/or disabled logic. A clock gate block 1210 receives a clock signal (clk) and an enable signal 1212 from a configurable register bit and generates a clock-gate signal 1214 for a group of flops 1220.

Figure 13A:
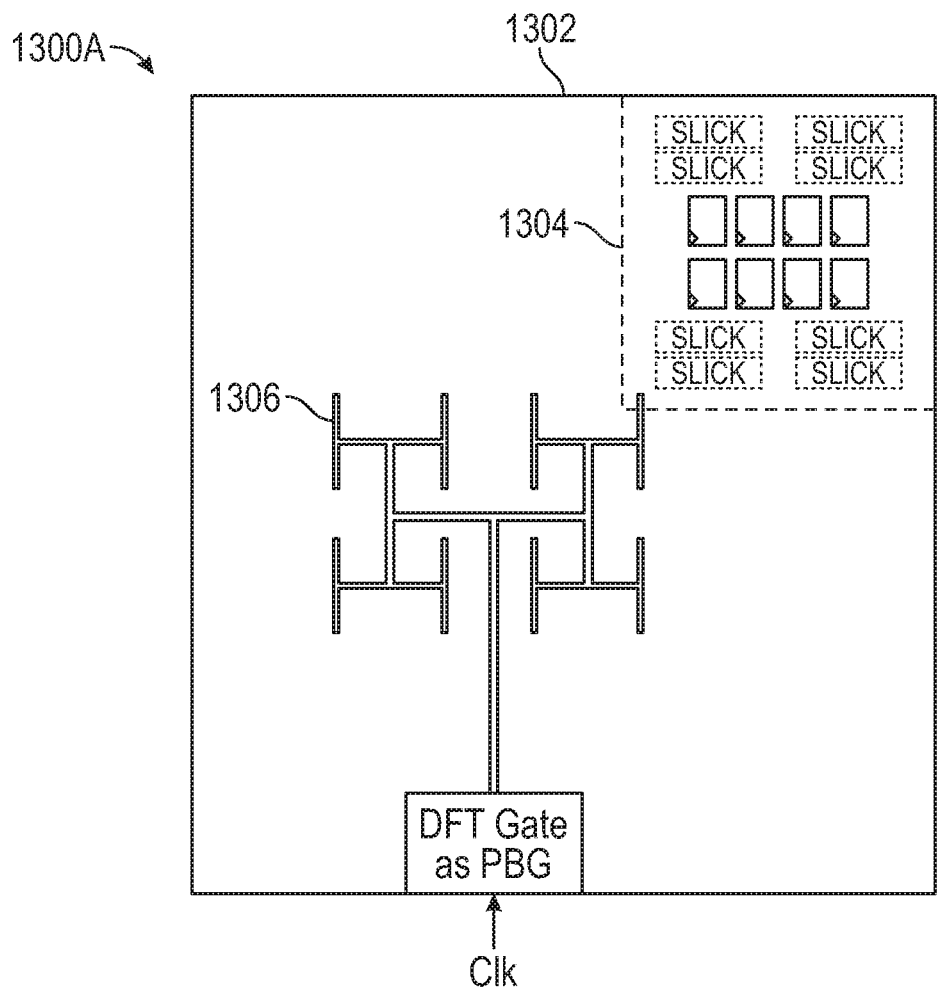
FIGS. 13A and 13B are schematic diagrams and charts illustrating examples of implementation of per physical-block gating (PBG) scheme and corresponding clock and clock-gating signals, in accordance with some aspects of the subject technology.
Figure 13B:
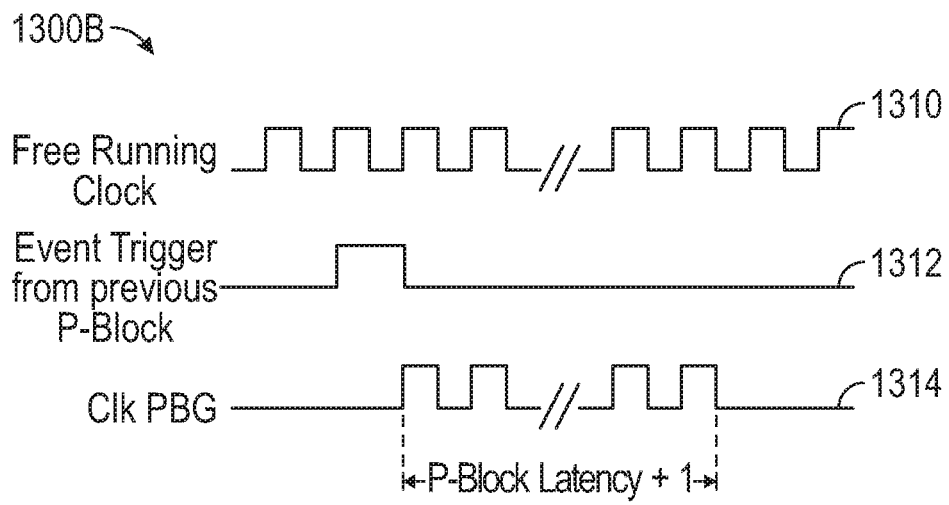

FIGS. 13A and 13B are a schematic diagram and a chart illustrating an example implementation of per PBG scheme 1300A and corresponding clock and clock-gating signals 1300B, in accordance with some aspects of the subject technology. The PBG scheme 1300A is implemented for a chip 1302 including a number of P-blocks 1304 (sink grid boxes) and a H-tree clock distribution 1306. The corresponding clock and clock-gating signals 1300B includes a free-running clock 1310, an event trigger signal 1312 from a previous P-block and a clk PBG signal 1314, which starts at the falling edge of the event trigger signal 1312 and continues with the same rate as the clock 1310 for a period equal to a P-block latency +1. The PBG scheme 1300 is dynamic, similar to the existing per-stage clock gating, just pulled up to a P-block level. Conceptually, it is possible to turn off the clock network for the entire P-block when there is inactivity for more than the latency of a P-block.

Figure 14:
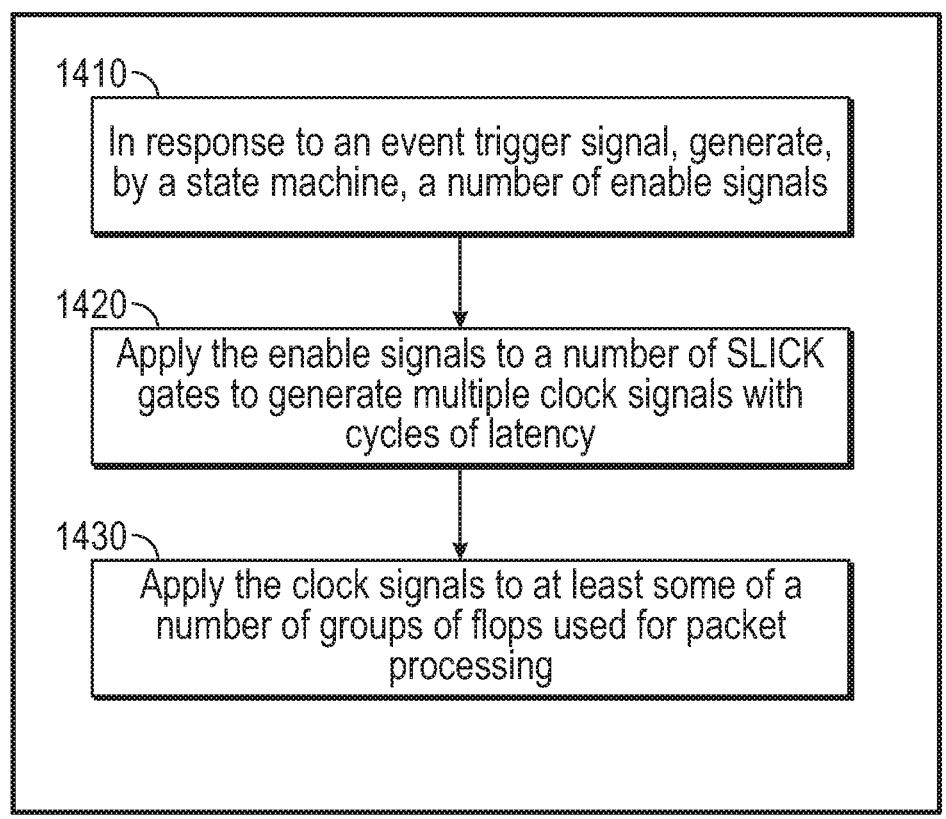
FIG. 14 is a flow diagram illustrating an example process for power-smart packet processing, in accordance with some aspects of the subject technology.

SLICK works seamlessly with PBG; however, besides introducing multiple level of gates, PBG will have following issues: (1) free-running clock may be needed for certain logic and/or feed-thru flops at the same or different clocks, hence requiring a separate H-Tree which defeats the very purpose of PBG; (2) most of the clock power is consumed inside the sink grid box and only a small fraction in H-Tree clock distribution (less than 5% for current chips), hence, targeted savings are very small for PBG; (3) optimal P-block sizes are getting bigger with advanced nodes and tool capabilities that helps area, resources and schedule; this, however, goes against PBG, which provides benefit only with smaller P-blocks latencies; and (4) requires specific inactivity pattern to save even a small amount of power that adds latency, area and may cause performance degradation. As an example, for a P-block with latency of 50 cycles, there needs to be a continuous inactivity for at least 52 cycles to save power for one cycle. Note that there is a great area/latency cost to control activity for such a long pattern. FIG. 14 is a flow diagram illustrating an example process 1400 for power-smart packet processing, in accordance with some aspects of the subject technology. A process 1400 includes, in response to an event trigger signal (e.g., 250 of FIG. 2B), generating, by a state machine (e.g., 202 of FIG. 2A), a number of enable signals (e.g., 251 through 254 of FIG. 2B) (1410). The method further includes applying the enable signals to a number of SLICK gates (e.g., 210 of FIG. 2A) to generate multiple clock signals with cycles of latency (1420). The clock signals are applied to at least some of a number of groups of flops (e.g., 220 of FIG. 2A) used for packet processing (1430). The enable signals are clock-gated enable signals that start at consecutive cycles of a main clock (e.g., 230 of FIG. 2B) and stay active for at least one cycle of the main clock.

Figure 15:
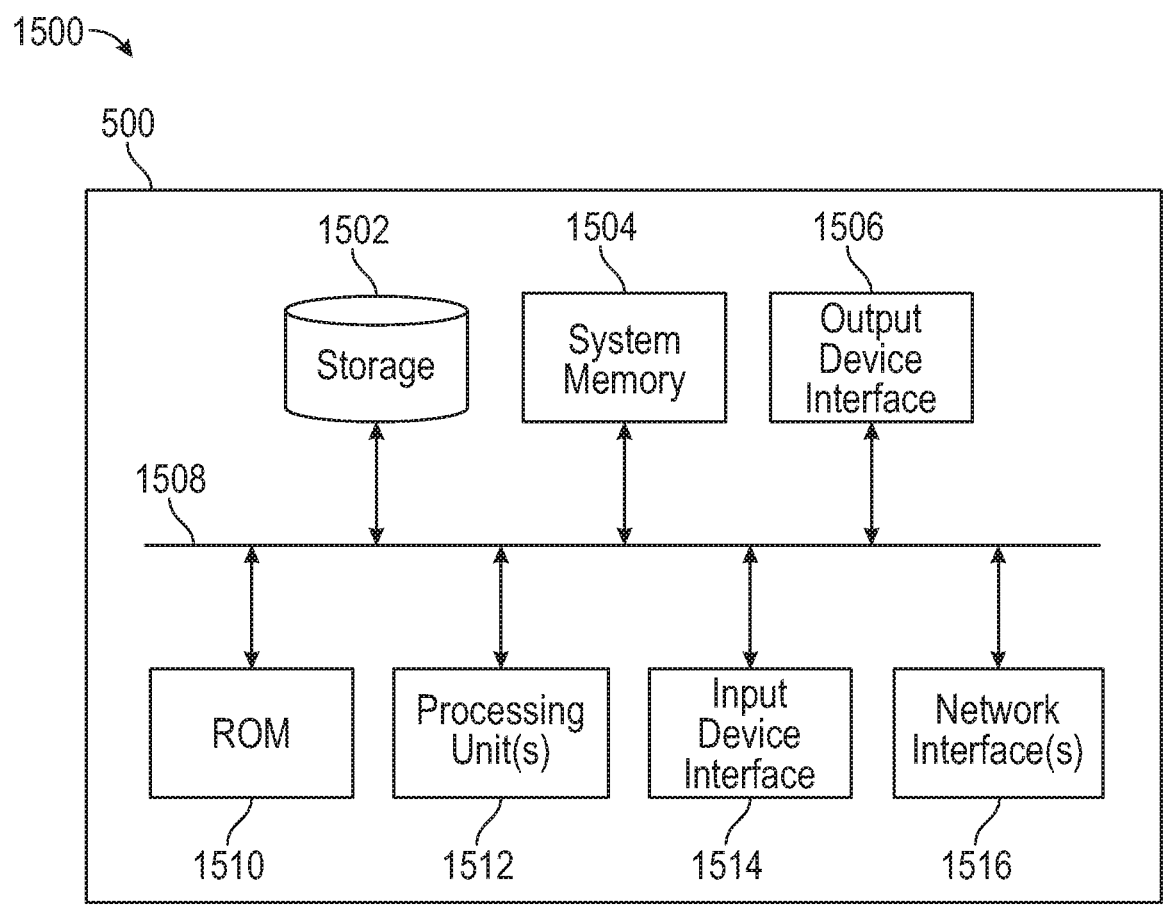
FIG. 15 is an electronic system within which some aspects of the subject technology are implemented.

FIG. 15 is an electronic system 1500 within which some aspects of the subject technology are implemented. The electronic system 1500 can be, and/or can be a part of, the network switch of a data center or an enterprise network. The electronic system 1500 may include various types of computer readable media and interfaces for various other types of computer readable media. The electronic system 1500 includes a bus 1508, one or more processing unit(s) 1512, a system memory 1504 (and/or buffer), a ROM 1510, a permanent storage device 1502, an input device interface 1514, an output device interface 1506, and one or more network interfaces 1516, or subsets and variations thereof.

The bus 1508 collectively represents all system, peripheral, and chipset buses that communicatively connect the numerous internal devices of the electronic system 1500. In one or more implementations, the bus 1508 communicatively connects the one or more processing unit(s) 1512 with the ROM 1510, the system memory 1504, and the permanent storage device 1502. From these various memory units, the one or more processing unit(s) 1512 retrieves instructions to execute and data to process in order to execute the processes of the subject disclosure. The one or more processing unit(s) 1512 can be a single processor or a multi-core processor in different implementations.

The ROM 1510 stores static data and instructions that are needed by the one or more processing unit(s) 1512 and other modules of the electronic system 1500. The permanent storage device 1502, on the other hand, may be a read-and-write memory device. The permanent storage device 1502 may be a nonvolatile memory unit that stores instructions and data, even when the electronic system 1500 is off. In one or more implementations, a mass-storage device (such as a magnetic or optical disk and its corresponding disk drive) may be used as the permanent storage device 1502.

In one or more implementations, a removable storage device (such as a floppy disk, flash drive, and its corresponding disk drive) may be used as the permanent storage device 1502. Similar to the permanent storage device 1502, the system memory 1504 may be a read-and-write memory device. However, unlike the permanent storage device 1502, the system memory 1504 may be a volatile read-and-write memory, such as random access memory. The system memory 1504 may store any of the instructions and data that one or more processing unit(s) 1512 may need at runtime. In one or more implementations, the processes of the subject disclosure are stored in the system memory 1504, the permanent storage device 1502, and/or the ROM 1510. From these various memory units, the one or more processing unit(s) 1512 retrieves instructions to execute and data to process in order to execute the processes of one or more implementations.

The bus 1508 also connects to the input and output device interfaces 1514 and 1506. The input device interface 1514 enables a user to communicate information and select commands to the electronic system 1500. Input devices that may be used with the input device interface 1514 may include, for example, alphanumeric keyboards and pointing devices (also called "cursor control devices"). The output device interface 1506 may enable, for example, the display of images generated by electronic system 1500. Output devices that may be used with the output device interface 1506 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 15, the bus 1508 also couples the electronic system 1500 to one or more networks and/or to one or more network nodes, through the one or more network interface(s) 1516. In this manner, the electronic system 1500 can be a part of a network of computers (such as a LAN, a wide-area network ("WAN")), or an Intranet, or a network of networks, such as the Internet. Any or all components of the electronic system 1500 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be nontransitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any nonsemiconductor memory, such as optical disk storage, magnetic disk storage, magnetic tape, other magnetic storage devices, or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or nonexecutable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, among other resources. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station," "receiver," "computer," "server," "processor," and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to," "operable to," and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A method for power-smart packet processing, the method comprising:
   in response to an event trigger signal, generating, by a state machine, a plurality of enable signals;
   applying the plurality of enable signals to a plurality of single-level inferred clock (SLICK) gates to generate a plurality of clock signals with cycles of latency; and
   applying the plurality of clock signals to at least some of a plurality of groups of flops used for packet processing,
   wherein:
   the plurality of enable signals are clock-gated enable signals that start at consecutive cycles of a main clock, and stay active for at least one cycle of the main clock.

2. The method of claim 1, wherein the plurality of SLICK gates are inferred by a synthesis process.

3. The method of claim 1, wherein the plurality of enable signals comprise two-cycle enable signals that stay active for two cycles of the main clock.

4. The method of claim 3, wherein each group of the plurality of groups of flops is enabled using two-cycle enable signals to achieve power saving.

5. The method of claim 1, wherein a single-cycle data-enable signal is used for data.

6. The method of claim 1, further comprising implementing the plurality of flops and the plurality of SLICK gates on a chip with increased sink grid box size and a reduced H-tree clock distribution level and size to reduce clock power consumption.

7. The method of claim 1, further comprising using flow-aware clock-gating technology (FACT) to distinctly identify logic and tables that are associated with specific flows and coding the identified logic and tables in registered-level logic (RTL) with the plurality of enable signals along with recirculating multiplexers (MUXes).

8. The method of claim 7, further comprising using static enable signals for the tables.

9. The method of claim 7, further comprising using dynamic enable signals for unused tables.

10. The method of claim 7, further comprising identifying a set of enable signals at an increased granularity and breaking functions into smaller, mutually exclusive functions to effectively use the identified set of enable signals.

11. The method of claim 1, further comprising using continually variable traffic (CVT) to control packet rate and packet spacing.

12. The method of claim 11, further comprising:
supporting a dynamic profile selection to precisely control increase of operating power without sacrificing performance;
reducing a number of transitions to a lowest possible level in a given traffic profile to save cell logic power; and
controlling of active events across pipes in a chip quadrant and staggering active events across the chip quadrant, as allowed by a given traffic pattern.

13. The method of claim 11, further comprising:
monitoring, using one or more processors, conditions and programming the CVT accordingly, and
using a timer to enable automatic switching over to different profiles in case a faster response than a profile supported by the one or more processors is required.

14. A system comprising:
memory;
one or more processors coupled to the memory and configured to execute instructions to perform following acts:
generate a plurality of enable signals in response to an event trigger signal;
apply the plurality of enable signals to a plurality of SLICK gates to generate a plurality of clock signals; and
apply the plurality of clock signals to at least some of a plurality of sets of flops used for packet processing,
wherein:
the plurality of enable signals are at least one-cycle clock-gated enable signals synchronized with consecutive cycles of a main clock, and
the plurality of clock signals are generated with cycles of latency.

15. The system of claim 14, wherein the one or more processors are further configured to infer the plurality of SLICK gates by a synthesis process, and wherein the plurality of enable signals comprise two-cycle enable signals that stay active for two cycles of the main clock.

16. The system of claim 15, wherein the one or more processors are further configured to enable each set in a set of groups of flops using two-cycle enable signals to achieve power saving.

17. The system of claim 14, wherein the one or more processors are further configured to:

use FACT to distinctly identify logic and tables that are associated with specific flows and coding the identified logic and tables in RTL with the plurality of enable signals along with recirculating MUXes;
use static enable signals for tables and logic for general power profiles;
use dynamic enable signals for unused tables and logic in a given flow; and
identify a set of enable signals at an increased granularity and to break functions into smaller, mutually exclusive functions to effectively use the identified set of enable signals.

18. The system of claim 14, wherein the one or more processors are further configured to:
use CVT to control packet rate and packet spacing;
support a dynamic profile selection to precisely control increase of operating power without sacrificing performance;
reduce a number of transitions to a lowest possible level in a given traffic profile to save cell logic power; and
control active events across pipes in a chip quadrant and stagger active events across the chip quadrant, as allowed by a given traffic pattern.

19. A network switch comprising:
one or more processing pipelines including a plurality of sets of flops;
a state machine configured to generate a plurality of clock-gating enable signals in response to an event trigger signal; and
a plurality of SLICK gates enabled by the plurality of clock-gating enable signals and configured to generate a plurality of clock signals with cycles of latency,
wherein,
the plurality of clock signals are applied to at least some of the plurality of sets of flops used for packet processing,
the plurality of clock-gating enable signals are synchronized with consecutive cycles of a main clock and comprise two-cycle signals.

20. The network switch of claim 19, wherein:
the plurality of SLICK gates are inferred by a synthesis process, the plurality of sets of flops and the plurality of SLICK gates are implemented on a chip with increased sink grid box size and a reduced H-tree clock distribution level and size to reduce clock power consumption, and
FACT is used to distinctly identify logic and tables that are associated with specific flows and coding the identified logic and tables in RTL with the plurality of clock-gating enable signals along with recirculating MUXes.

* * * * *